United States Patent
Ito et al.

(10) Patent No.: US 8,314,536 B2
(45) Date of Patent: Nov. 20, 2012

(54) PIEZOELECTRIC SENSOR AND METHOD FOR MANUFACTURING THE SAME

(75) Inventors: Koji Ito, Yatomi (JP); Mitsuhiro Ando, Toyohashi (JP); Shunsuke Kogure, Toyota (JP); Hitoshi Takayanagi, Kariya (JP); Nobuhiro Moriyama, Chuo-ku (JP); Iwao Matsunaga, Niigata (JP); Ryuichi Sudo, Niigata (JP)

(73) Assignees: Aisin Seiki Kabushiki Kaisha, Kariya-Shi, Aichi (JP); Kureha Corporation, Chuo-Ku, Tokyo (JP)

( * ) Notice: Subject to any disclaimer, the term of this patent is extended or adjusted under 35 U.S.C. 154(b) by 635 days.

(21) Appl. No.: 12/514,556

(22) PCT Filed: Nov. 8, 2007

(86) PCT No.: PCT/JP2007/071718
§ 371 (c)(1),
(2), (4) Date: May 12, 2009

(87) PCT Pub. No.: WO2008/059751
PCT Pub. Date: May 22, 2008

(65) Prior Publication Data
US 2009/0289529 A1    Nov. 26, 2009

(30) Foreign Application Priority Data
Nov. 13, 2006  (JP) ................................. 2006-306177

(51) Int. Cl.
*H01L 41/08* (2006.01)
(52) U.S. Cl. .................................................... 310/365
(58) Field of Classification Search .................. 310/311, 310/313, 358, 363–365, 328, 338; 73/715, 73/727; *H01L 41/08, 41/047*
See application file for complete search history.

(56) References Cited

U.S. PATENT DOCUMENTS
| 7,152,482 | B2 * | 12/2006 | Ueno et al. ...................... 73/727 |
| 7,982,367 | B2 * | 7/2011 | Uetani et al. .................. 310/365 |
| 2005/0093401 | A1 * | 5/2005 | Raisanen ....................... 310/365 |
| 2006/0144154 | A1 | 7/2006 | Ueno et al. |

FOREIGN PATENT DOCUMENTS
EP    0 219 149 A1    4/1987
(Continued)

OTHER PUBLICATIONS

Official Action issued on Aug. 18, 2011 by the Japanese Patent Office in corresponding Japanese Patent Application No. 2006-306177.
Extended European Search Report issued on Jul. 21, 2011 by the European Patent Office in corresponding European Patent Application No. 07 831 449.9.

(Continued)

*Primary Examiner* — Thomas Dougherty
*Assistant Examiner* — Karen B Addison
(74) *Attorney, Agent, or Firm* — Buchanan Ingersoll & Rooney PC

(57) ABSTRACT

An inexpensive piezoelectric sensor where noise unlikely occurs and a method for manufacturing the same are provided. A piezoelectric body (2) made of polymeric material, a first electrode-supporting portion (3) disposed at one side of the piezoelectric body (2) and supporting a signal electrode (3b) on a first insulator (3a), and a second electrode-supporting portion (4) disposed at the other side of the piezoelectric body (2) and supporting a ground electrode (4b) on a second insulator (4a) are included, and the first electrode-supporting portion (3) and the second electrode-supporting portion (4) are arranged so that the signal electrode (3b) and the ground electrode (4b) overlap each other in a layering direction.

18 Claims, 2 Drawing Sheets

FOREIGN PATENT DOCUMENTS

| | | | |
|---|---|---|---|
| EP | 0 576 400 | A1 | 12/1993 |
| JP | 61-165438 | U | 10/1986 |
| JP | 62-56829 | A | 3/1987 |
| JP | 5-249135 | A | 9/1993 |
| JP | 7-49354 | A | 2/1995 |
| JP | 7-79022 | A | 3/1995 |
| JP | 8-75575 | A | 3/1996 |
| JP | 10-076843 | A | 3/1998 |
| JP | 10-332509 | A | 12/1998 |
| JP | 2000-337979 | A | 12/2000 |
| JP | 33658322 | B2 | 1/2003 |
| JP | 2003-066154 | A | 3/2003 |
| JP | 2003-185507 | A | 7/2003 |
| JP | 2005-156531 | A | 6/2005 |

OTHER PUBLICATIONS

International Search Report for PCT/JP2007/071718, mailed Jan. 8, 2008.

Written Opinion of the International Searching Authority for PCT/JP2007/071718, mailed Jan. 8, 2008.

International Preliminary Report on Patentability for PCT/JP2007/071718, mailed Oct. 10, 2009.

English language translation of International Preliminary Report on Patentability (Forms PCT/IB/338 and PCT/IPEA/409) issued in PCT/JP2007/071718, Jul. 16, 2009, The International Bureau of WIPO, Geneva, CH.

\* cited by examiner

PIEZOELECTRIC SENSOR AND METHOD FOR MANUFACTURING THE SAME

FIELD OF THE INVENTION

The present invention relates to a piezoelectric sensor including a piezoelectric body made of polymeric material and a method for manufacturing the same.

BACKGROUND OF THE ART

According to a conventionally known piezoelectric sensor including a piezoelectric body made of polymeric material, especially polyvinylidene fluoride (PVDF), both sides of the piezoelectric body are applied with silver paste so as to form a signal electrode at one side and a ground electrode at the other side (for example, see Patent Document 1). Furthermore, an insulating layer and a shield layer are respectively layered at the signal electrode side of the piezoelectric body via an adhesive in this kind of piezoelectric sensor, and an insulating layer is layered at the ground electrode side of the piezoelectric body via an adhesive.

Such piezoelectric sensor is applied, for example, as a pressure sensor for detecting a load applied to an elastic supporting body such as beds, mats, and seats and determining the presence or non-presence of humans, animals, and objects. When the piezoelectric sensor is applied as such a pressure sensor, the pressure sensor is formed by forming the piezoelectric body in accordance with a layout of the pressure sensor relative to a supporting body and by arranging electrodes and wiring on the surface of the piezoelectric body in order to accurately arrange the piezoelectric sensor at a load detection position in the supporting body.

However, since the polymeric material, especially PVDF, being applied as a piezoelectric body is very expensive, there is a problem that product costs increase because of a piezoelectric body being applied to a wiring portion which is not used as a piezoelectric sensor as the above-mentioned conventional piezoelectric sensor. When wiring is arranged on the surface of the piezoelectric body, this wiring has a slight sensitivity. Accordingly, there is also a problem that noise occurs due to deformation of the wiring portion.

Furthermore, electrodes are provided in the conventional piezoelectric sensor by applying silver paste directly to the surface of the piezoelectric body. However, for example, since a heat-resistance temperature of PVDF is low such as 120 degrees Celsius or lower, piezoelectric properties may deteriorate when the silver paste is dried at a usual drying temperature of approximately 150 degrees Celsius. On the other hand, when silver paste being able to be dried at 100 degrees Celsius or lower is applied, although the deterioration of the piezoelectric properties may be prevented, there is a problem that production efficiency decreases and production costs increase because drying takes a long time.

The present invention is provided in consideration of the above problems and intended to provide an inexpensive piezoelectric sensor in which noise unlikely occurs and a method for manufacturing the same.

Patent Document 1: JP 1998-332509A (Paragraph 0008, FIG. 4)

DISCLOSURE OF THE INVENTION

A first configuration of a piezoelectric sensor according to the present invention for achieving the aforementioned purpose includes a first electrode-supporting portion supporting a signal electrode on a first insulator, a second electrode-supporting portion supporting a ground electrode on a second insulator, and a piezoelectric body, which is made of polymeric material disposed between the first electrode-supporting portion and the second electrode-supporting portion, being characterized in that the first electrode-supporting portion and the second electrode-supporting portion are disposed so that the signal electrode and the ground electrode overlap each other in a layering direction, further, the signal electrode is supported at a side of the piezoelectric body of the first insulator and the ground electrode is supported at a side of the piezoelectric body of the second insulator.

That is, according to this configuration, the piezoelectric sensor is formed by disposing the piezoelectric body in accordance with the first electrode-supporting portion and the second electrode-supporting portion. Hereby, as compared to the case where a piezoelectric sensor is conventionally obtained by setting a piezoelectric body as a basis and by forming electrodes on the piezoelectric body, the consumption of the piezoelectric body is reduced, thereby largely reducing production costs.

Since wiring relative to the piezoelectric sensor may be disposed on an insulator supporting an electrode thereon, the wiring will not have sensitivity and occurrence of noise is prevented. Moreover, because the electrode is supported on an insulating film, a method for manufacturing electrodes will not be limited, so that production efficiency is improved. Consequently, an inexpensive piezoelectric sensor in which noise unlikely occurs is provided.

A second configuration of the piezoelectric sensor according to the present invention is characterized in that the first electrode-supporting portion and the second electrode-supporting portion are configured as a first electrode-supporting layer and a second electrode-supporting layer respectively and that the piezoelectric body is supported between the first electrode-supporting layer and the second electrode-supporting layer.

That is, as this configuration, a layered piezoelectric sensor is formed by supporting the piezoelectric body between the first electrode-supporting layer and the second electrode-supporting layer.

A third configuration of the piezoelectric sensor according to the present invention is characterized in that the first electrode-supporting layer and the second electrode-supporting layer are arranged so that an electrode supported at the side of each of the first electrode-supporting layer and the second electrode-supporting layer are fixed so as to be closely provided at the piezoelectric body via a fixative.

That is, as this configuration, even when various external forces are applied to the piezoelectric sensor, a distance between the piezoelectric body and the first electrode-supporting layer and a distance between the piezoelectric body and the second electrode-supporting layer is surely held constant by fixing the first electrode-supporting layer and the second electrode-supporting layer to the piezoelectric body via the fixative, thereby further stabilizing sensitivity of the piezoelectric sensor.

A fourth configuration of the piezoelectric sensor according to the present invention is characterized in that the signal electrode and the ground electrode are firmly attached to the piezoelectric body.

That is, as this configuration, the signal electrode and the ground electrode are firmly attached directly to the piezoelectric body, thereby forming a favorable dielectric connection not being affected when various external forces are applied to the piezoelectric sensor. Consequently, an electric charge produced at the piezoelectric body is surely read out as a voltage signal and sensitivity as a piezoelectric sensor is improved.

A fifth configuration of the piezoelectric sensor according to the present invention is characterized in that the first electrode-supporting layer and the second electrode-supporting layer are closely attached to each other at the piezoelectric body side.

That is, according to this configuration, the first electrode-supporting layer and the second electrode-supporting layer are firmly attached to each other, so that a fixative or the like is not required and production costs of the piezoelectric sensor are reduced.

A sixth configuration of the piezoelectric sensor according to the present invention is characterized in that the piezoelectric body is partially provided relative to surfaces of the first electrode-supporting layer and the second electrode-supporting layer at the side of the piezoelectric body.

That is, according to the configuration, a using amount of the piezoelectric body may be reduced and manufacturing costs may be reduced.

A seventh configuration of the piezoelectric sensor according to the present invention is characterized in that a shielding electrode is provided on the first-electrode supporting layer at an opposite side of the first electrode-supporting layer where the signal electrode is supported.

That is, an external noise is prevented from intruding into the signal electrode.

An eighth configuration of the piezoelectric sensor according to the present invention is characterized in that a protective film for covering the shielding electrode is fixed at the first electrode-supporting layer.

That is, according to the configuration, the shielding electrode may be protected from an external mechanical stress.

A ninth configuration of the piezoelectric sensor according to the present invention is characterized in that the signal electrode and the ground electrode are supported by applying metal paste on the surfaces of the first insulator and the second insulator or by applying metal films to the surfaces of the first insulator and the second insulator.

That is, according to the configuration, the signal electrode and the ground electrode are appropriately supported on the first insulator and the second insulator, respectively.

A first configuration of a pressure sensor according to the present invention is characterized in that the pressure sensor includes the piezoelectric sensor, a wiring portion for transmitting a read out signal of the piezoelectric sensor and a slit provided around the piezoelectric sensor.

A second configuration of the pressure sensor according to the present invention is characterized in that the pressure sensor includes the piezoelectric sensor and a wiring portion for transmitting a read out signal from the piezoelectric sensor, wherein wiring of the wiring portion from the signal electrode is configured so as to extend over the same surface as the signal electrode of the first electrode-supporting layer while wiring of the wiring portion from the ground electrode is configured so as to extend over the same surface as the ground electrode of the second electrode-supporting layer.

The piezoelectric sensor according to the present invention is favorably adapted as the pressure sensor.

A first means of a method for manufacturing the piezoelectric sensor according to the present invention is characterized in that a process for preparing a piezoelectric body made of a polymeric material, a first supporting process for supporting the signal electrode on one surface of a first insulating film to manufacture the first electrode-supporting layer, a second supporting process for supporting the ground electrode on one surface of a second insulating film to manufacture the second electrode-supporting layer, and a layering process for layering the first electrode-supporting layer on one side of the piezoelectric body made of a polymeric material and for layering the second electrode-supporting layer on the other side of the piezoelectric body so that the signal electrode and the ground electrode are provided at the side of the piezoelectric body, are provided.

That is, as this configuration, the first electrode-supporting layer supporting the signal electrode on the first insulating film and the second electrode-supporting layer supporting the ground electrode on the second insulating film are layered on the piezoelectric body, thereby reducing the consumption of the piezoelectric body and production costs, compared to the case where a piezoelectric sensor is conventionally formed by forming electrodes on a underlying piezoelectric body.

Since wiring of the piezoelectric sensor may be arranged on the first electrode-supporting layer and the second electrode-supporting layer respectively, the wiring will not have sensitivity and occurrence of noise is prevented.

Moreover, the signal electrode is supported on the first insulating film and the ground electrode is supported on the second insulating film, so that a method for manufacturing electrodes is not subjected to restrictions, thereby improving production efficiency. Consequently, an inexpensive piezoelectric sensor in which noise unlikely occurs is obtained.

A second means of the method for manufacturing the piezoelectric sensor according to the present invention is characterized in that a fixative is applied to the surface of each of the first electrode-supporting layer and the second electrode-supporting layer where the electrode is supported before the layering process. The second means of the method for manufacturing the piezoelectric sensor according to the present invention is further characterized in that the first electrode-supporting layer and the second electrode-supporting layer are layered in the layering process by closely fixing the electrode supported at the side of each of the first electrode-supporting layer and the second electrode-supporting layer where the electrode is not supported, to the piezoelectric body via the fixative.

That is, as this configuration, the first electrode-supporting layer and the second electrode-supporting layer are firmly attached to be fixed to the piezoelectric body via a fixative. Accordingly, a substance having a low dielectric constant such as air is prevented from intruding between the first electrode-supporting layer and the piezoelectric body and between the second electrode-supporting layer and the piezoelectric body. Furthermore, a distance between the first electrode-supporting layer and the piezoelectric body and a distance between the second electrode-supporting layer and the piezoelectric body are hold constant and the piezoelectric sensor maintaining high sensitivity is obtained.

BEST MODE TO PRACTICE THE INVENTION (First Embodiment)

A first embodiment of a piezoelectric sensor according to the present invention will be explained with reference to drawings as follows.

Figure 1:
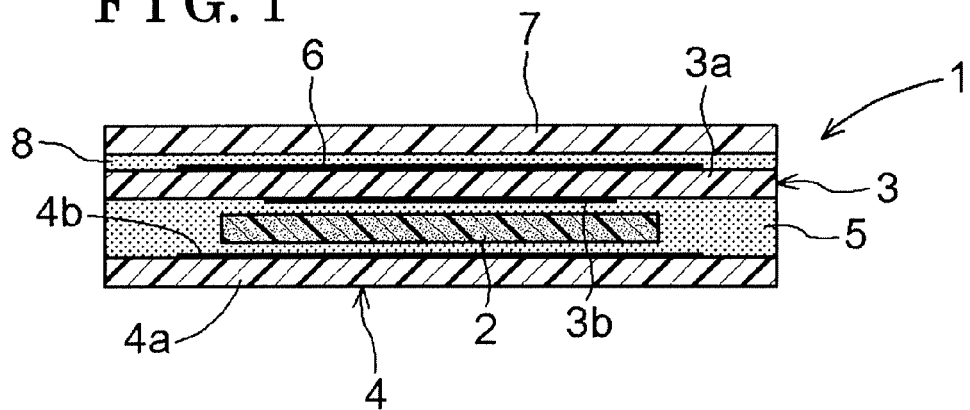
FIG. 1 is a cross-section view illustrating a piezoelectric sensor according to a first embodiment.

As illustrated in FIG. 1, the piezoelectric sensor 1 according to the embodiment includes a piezoelectric body 2 made of polyvinylidene fluoride (PVDF) which is planar polymeric material, a first electrode-supporting layer 3 supporting a signal electrode 3b on one surface of a first insulating film 3a serving as a first insulator, and a second electrode-supporting layer 4 supporting a ground electrode 4b on one surface of a second insulating film 4a serving as a second insulator. Since the piezoelectric body 2 produces an electric charge by a piezoelectric effect, the produced electric charge is read out as a voltage signal by disposing an electrode on the piezoelectric body 2.

The first electrode-supporting layer 3 is disposed at one side (upper side in FIG. 1) of the piezoelectric body 2 while the second electrode-supporting layer 4 is disposed at the other side 2 (lower side in FIG. 1) of the piezoelectric body 2 in the piezoelectric sensor 1, so that the layered piezoelectric sensor is formed by supporting the piezoelectric body 2 between the first electrode-supporting layer 3 and the second electrode-supporting layer 4. Furthermore, the first electrode-supporting layer 3 and the second electrode-supporting layer 4 are arranged so that the signal electrode 3b and the ground electrode 4b overlap each other in a layering direction in a such a way that an electric charge produced by a piezoelectric effect is read out as a voltage signal. In this way, the piezoelectric body 2 is disposed only in predetermined positions corresponding to the first electrode-supporting layer 3 and the second electrode-supporting layer 4 in the piezoelectric sensor according to the embodiment, thereby reducing the consumption of the piezoelectric body 2 and production costs. In addition, the first electrode-supporting layer 3 and the second electrode-supporting layer 4 configure "a first electrode-supporting portion" and "a second electrode-supporting portion" respectively in this embodiment.

In the piezoelectric sensor 1 according to the embodiment, the first electrode-supporting layer 3 and the second electrode-supporting layer 4 are arranged so that the surface (side) of the first electrode-supporting layer 3 supporting the signal electrode 3b and the surface (side) of the second-electrode supporting layer 4 supporting the ground electrode 4b respectively are layered toward the piezoelectric body 2. The first electrode-supporting layer 3 and the second electrode-supporting layer 4 are arranged by applying a fixative 5 to a surface (side) of each of the first electrode-supporting layer 3 and the second electrode-supporting layer 4 where an electrode is supported so that the signal electrode 3b and the ground electrode 4b are closely fixed to the piezoelectric body 2 via the fixative 5. By closely fixing the signal electrode 3b and the ground electrode 4b to the piezoelectric body 2 via the fixative in this way, a favorable dielectric connection is created and an electric charge produced in the piezoelectric body 2 is surely read out as a voltage signal, for example, when the piezoelectric sensor 1 is largely deformed by an external force applied to the piezoelectric sensor 1. Accordingly, sensitivity as the piezoelectric sensor 1 is improved.

In this embodiment, the signal electrode 3b is formed into a size included within the region where the ground electrode 4b is located and within the region where piezoelectric body 2 is located in a layering direction. Hereby, the signal electrode 3b inevitably has a surface corresponding to the piezoelectric body 2 and the ground electrode 4b. Accordingly, the electric charge produced by the piezoelectric effect of the piezoelectric body 2 is read out from the whole surface of the signal electrode 3b as a voltage signal with no waste.

The signal electrode 3b is supported on the first electrode-supporting layer 3 and the ground electrode 4b is supported on the second electrode-supporting layer 4, for example, by applying metal paste such as silver or a metal film to the surface of the first insulating film 3a and the surface of the second insulating film respectively. For example, resin films such as polyethylene terephthalate (PET) and polyethylene naphthalate (PEN) may be applied as the first insulating film 3a and the second insulating film 4a. When metal paste applied to a surface as an electrode is dried, the metal paste is dried at a usual drying temperature of approximately 150 degrees because such resin films have high heat resistance. Consequently, the drying time is reduced and production efficiency is improved.

The fixative 5 may apply adhesive or tackiness agent of, for example, reaction system, solution system, and hot-melt system, and a fixative is not particularly limited. However, from a viewpoint of maintaining sensitivity as the piezoelectric sensor 1, it is preferable to select a fixative having a high dielectric constant in order to dispose a fixative between electrodes. Moreover, from a similar viewpoint, it is preferable to fix the first electrode-supporting layer 3 and the second electrode-supporting layer 4 so that a distance between the piezoelectric body 2 and the first electrode-supporting layer 3 and a distance between the piezoelectric body 2 and the second electrode-supporting layer 4 are reduced.

Furthermore, in this embodiment, a shielding electrode 6 is provided on the first electrode-supporting layer 3 at the opposite side of the first electrode-supporting layer 3 where the signal electrode 3b is supported in order to prevent external noise from intruding into the signal electrode 3b. A protective film 7 for protecting the shielding electrode 6 from external mechanical stress is provided on the first electrode-supporting layer 3 via a fixative 8. The shielding electrode 6 is supported on the first electrode-supporting layer 3 in the same way as the signal electrode 3b. As long as the protective film 7 is an insulating film, material of the protective film 7 is not particularly limited. However, if the protective film 7 is a resin film such as polyethylene terephthalate (PET) and polyethylene naphthalate (PEN), the resin film may preferably be applied because of high mechanical strength. In particular, if the same material as the first insulating film 3a is applied to the protective film 7, occurrence of warpage or the like is prevented due to the same coefficient of thermal expansion even in the case where both of the first insulation film 3a and the protective film 7 are thermally treated during fixation. In addition, the fixative 8 may be the same as or different from the fixative 6.

Figure 2:
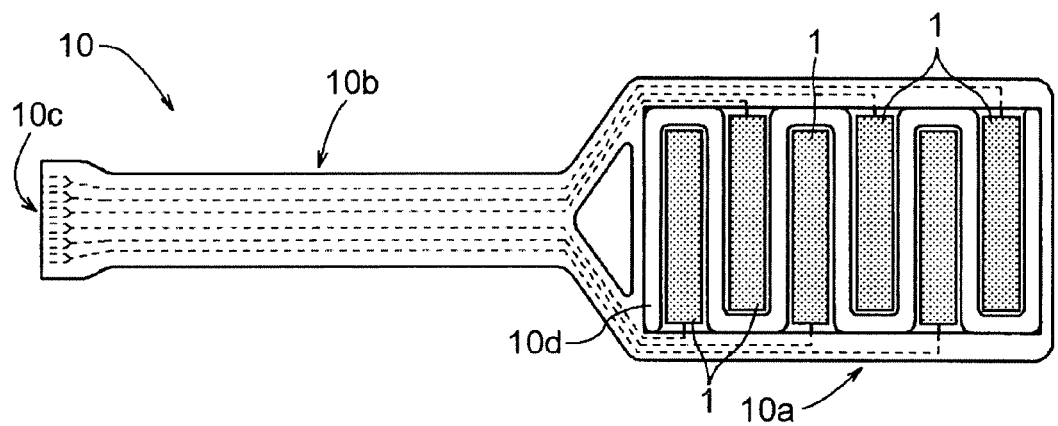
FIG. 2 is a configuration diagram illustrating a pressure sensor including piezoelectric sensors.

Such piezoelectric sensor 1 may be applied, for example, to a pressure sensor 10 as illustrated in FIG. 2. The pressure sensor 10 includes a detecting portion 10a provided with a plurality of the piezoelectric sensors 1 and a wiring portion 10b for transmitting read out signals of the piezoelectric sensors 1. In this embodiment, six of the piezoelectric sensors 1 are disposed in the detecting portion 10a, and a slit 10d is provided around the piezoelectric sensors 1 in order to prevent deformation of the piezoelectric sensors 1 from affecting one another.

The detecting portion 10a and the wiring portion 10b are formed integrally with the first electrode-supporting layer 3 and the second electrode-supporting layer 4 that configure the piezoelectric sensor 1. Wiring from the signal electrode 3b of the piezoelectric sensor 1 extends over the same surface as the signal electrode 3b of the first electrode-supporting layer 3 to a terminal portion 10c while wiring from the ground electrode 4b extends over the same surface as the ground electrode 4b of the second electrode-supporting layer 4 to the terminal portion 10c.

According to such a configuration, positioning of the piezoelectric sensor 1 as a detecting position may be easily determined by forming the first electrode-supporting layer 3 (the first insulating film 3a) and the second electrode-supporting layer 4 (the second insulating film 4a) in accordance with a layout of the piezoelectric sensor 1 relative to a supporting body and by arranging the piezoelectric body 2 in accordance with the first electrode-supporting layer 3 and the second electrode-supporting layer 4. Hereby, the consumption of PVDF is limited and production costs are reduced by disposing the piezoelectric body 2 made of PVDF only in the detecting portion 10a.

Moreover, since the wiring portion 10b does not have the piezoelectric body 2, wiring will not have sensitivity and occurrence of noise is prevented.

Such piezoelectric sensor 1 may be applied, for example, as a pressure sensor for detecting a load applied to an elastic supporting body such as beds, mats, seats and determining the presence or non-presence of humans, animals, and objects. In addition, the piezoelectric sensor 1 may be applied also as a biological information pressure sensor for detecting minute vibrations such as pulses and breathing of humans sitting on seats or the like and human actions due to variations of loads.

(Second Embodiment)

Figure 3:
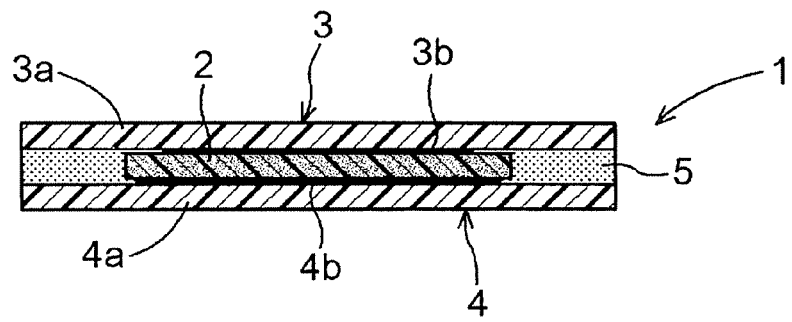
FIG. 3 is a cross-section view illustrating a piezoelectric sensor according to a second embodiment.

Next, a second embodiment of a piezoelectric sensor according to the present invention will be described. In the piezoelectric sensor 1 according to the embodiment as illustrated in FIG. 3, the first electrode-supporting layer 3 and the second electrode-supporting layer 4 are arranged so that the surface of the first electrode-supporting layer 3 supporting the signal electrode 3b and the surface of the second electrode-supporting layer 4 supporting the ground electrode 4b are layered respectively toward the piezoelectric body 2 and that the first insulating film 3a and the second insulating film 4a are fixed to the piezoelectric body 2 via the fixative 5 as well as the signal electrode 3b and the ground electrode 4b are closely attached directly to the piezoelectric body 2. Other configurations are the same as the first embodiment.

Even if the piezoelectric sensor 1 is largely deformed, a favorable dielectric connection which is not affected by the deformation is formed by closely attaching the signal electrode 3b and the ground electrode 4b directly to the piezoelectric body 2 in this way. Consequently, an electric charge produced in the piezoelectric body 2 is surely read out as a voltage signal and sensitivity as the piezoelectric sensor 1 is improved.

(Third Embodiment)

Figure 4:
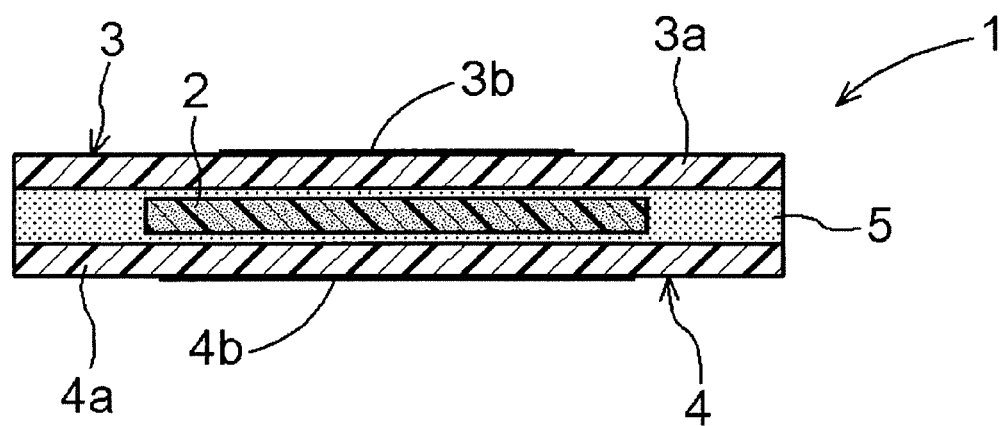
FIG. 4 is a cross-section view of a piezoelectric sensor according to a third embodiment.

Next, a third embodiment of a piezoelectric sensor according to the present invention will be described. In the piezoelectric sensor 1 according to the embodiment as illustrated in FIG. 4, the first electrode-supporting layer 3 and the second electrode-supporting layer 4 are arranged so that the surface of the first electrode-supporting layer 3 not supporting the signal electrode 3b and the surface of the second electrode-supporting layer 4 not supporting the ground electrode 4b are layered respectively toward the piezoelectric body 2 and that the first insulating film 3a and the second insulating film 4b are closely fixed to the piezoelectric body 2 via the fixative 5. Other configurations are the same as the first embodiment.

In the case of such a layered configuration, sensitivity of the piezoelectric sensor 1 is improved by selecting an insulating material having a high dielectric constant as the first insulating film 3a and the second insulating film 4a.

(Fourth Embodiment)

Figure 5:
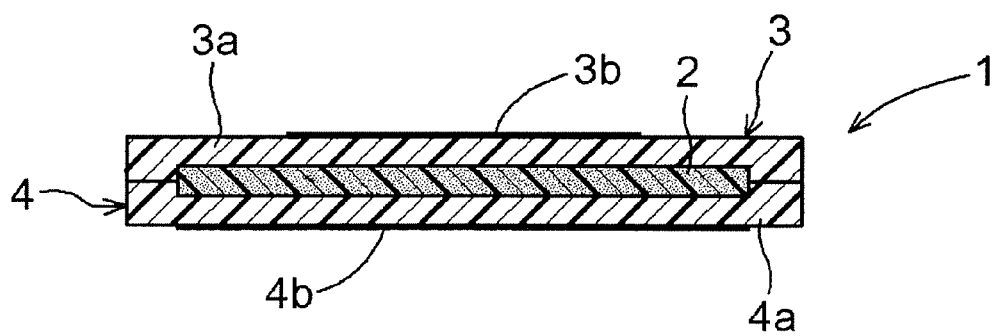
FIG. 5 is a cross-section view illustrating a piezoelectric sensor according to a fourth embodiment.

Next, a fourth embodiment of a piezoelectric sensor according to the present invention will be described. In the piezoelectric sensor 1 according to the embodiment as illustrated in FIG. 5, the first electrode-supporting layer 3 and the second-electrode supporting layer 4 are arranged so that the surface of the first electrode-supporting layer 3 not supporting the signal electrode 3b and the surface of the second electrode-supporting layer 4 not supporting the ground electrode 4b are layered respectively toward the piezoelectric body 2 to be thermally welded and that the first insulating film 3a and the second insulating film 4b are closely attached directly to the piezoelectric body 2. Other configurations are the same as the first embodiment.

With this configuration, a fixative is not required and production costs of the piezoelectric sensor 1 are reduced.

In addition, in the embodiment, the first electrode-supporting layer 3 and the second electrode-supporting layer 4 are integrated with each other by thermal welding, thereby serving as the first electrode-supporting portion and the second electrode-supporting portion respectively (Other Embodiments)

In each embodiment described above, both the first electrode-supporting layer 3 and the second electrode-supporting layer 4 are explained by the case in which the surface (side) of each of the first electrode-supporting layer 3 and the second electrode-supporting layer 4 where an electrode is supported or not supported is layered toward the piezoelectric body 2. However, one electrode-supporting layer may be arranged so that the surface supporting an electrode can be layered toward the piezoelectric body 2 while the other electrode-supporting layer may be arranged so that the surface (side) not supporting an electrode can be layered toward the piezoelectric body 2.

In each embodiment described above, an example in which the first electrode-supporting layer 3 and the second electrode-supporting layer 4 are fixed with the fixative 5 or using thermal welding is explained but a fixing method is not particularly limited. For example, the piezoelectric body 2 may be covered with insulators by using insert molding or the like by which the insulators are injection-molded relative to the piezoelectric body 2, thereby integrating the piezoelectric body 2 with the insulators. In this case, after the piezoelectric body 2 is covered with the insulators, the signal electrode 3b and the ground electrode 4b are disposed respectively at a corresponding position of the surfaces of each of the insulators. Accordingly, the first electrode-supporting portion and the second electrode-supporting portion are formed respectively.

In each embodiment described above, an example of the piezoelectric sensor 1 made of PVDF is explained but material of the piezoelectric sensor 1 is not particularly limited. For example, a piezoelectric sensor may be configured with a piezoelectric body made of polypropylene or the like which is planar polymeric material.

Industrial Applicability

The piezoelectric sensor according to the present invention is applied, for example, as a pressure sensor for detecting a load applied to an elastic body such as beds, mats, and seats and determining the presence or non-presence of humans, animals, and objects.

In addition, the piezoelectric sensor according to the present invention may be applied as a biological information pressure sensor for detecting minute vibrations such as pulses and breathing of humans sitting on seats or the like and human actions due to variations of loads.

The invention claimed is:

1. A piezoelectric sensor, comprising:
   a first electrode-supporting portion supporting a signal electrode on a first insulator;
   a second electrode-supporting portion supporting a ground electrode on a second insulator; and
   a piezoelectric body made of a polymeric material disposed between the first electrode-supporting portion and the second electrode-supporting portion, wherein
   the first electrode-supporting portion and the second electrode-supporting portion are arranged so that the signal electrode and the ground electrode overlap each other in a layering direction,
   the signal electrode is supported at a side of the piezoelectric body of the first insulator,
   the ground electrode is supported at a side of the piezoelectric body of the second insulator, and
   wherein the signal electrode possesses a size included within a region where the ground electrode is located and within a region where the piezoelectric body is located in the layering direction.

2. The piezoelectric sensor according to claim 1, wherein the first electrode-supporting portion and the second electrode-supporting portion are configured as a first electrode-supporting layer and a second electrode-supporting layer respectively and the piezoelectric body is supported between the first electrode-supporting layer and the second electrode-supporting layer.

3. The piezoelectric sensor according to claim 2, wherein the first electrode-supporting layer and the second electrode-supporting layer are arranged so that an electrode supported at the side of each of the first electrode-supporting layer and the second electrode-supporting layer is firmly attached to the piezoelectric body via a fixative.

4. The piezoelectric sensor according to claim 1 wherein the signal electrode and the ground electrode are firmly attached to the piezoelectric body.

5. The piezoelectric sensor according to claim 2, wherein the first electrode-supporting layer and the second electrode-supporting layer are closely attached to each other at the piezoelectric body side.

6. The piezoelectric sensor according to claim 2, wherein the piezoelectric body is partially provided relative to surfaces of the first electrode-supporting layer and the second electrode-supporting layer at a side of the piezoelectric body.

7. The piezoelectric sensor according to claim 2, wherein a shielding electrode is provided on the first-electrode supporting layer at an opposite side of the first electrode-supporting layer where the signal electrode is supported.

8. The piezoelectric sensor according to claim 7, wherein a protective film for covering the shielding electrode is fixed at the first electrode-supporting layer.

9. The piezoelectric sensor according to claim 1, wherein the signal electrode and the ground electrode are supported by applying metal paste on the surfaces of the first insulator and the second insulator or by applying metal films to the surfaces of the first insulator and the second insulator.

10. The a pressure sensor including the piezoelectric sensor, disclosed in claim 1, a wiring portion for transmitting a read out signal of the piezoelectric sensor and a slit provided around the piezoelectric sensor.

11. The pressure sensor includes the piezoelectric sensor, disclosed in claim 2, and a wiring portion for transmitting a read out signal from the piezoelectric sensor, wherein wiring of the wiring portion from the signal electrode is configured so as to extend over the same surface as the signal electrode of the first electrode-supporting layer while wiring of the wiring portion from the ground electrode is configured so as to extend over the same surface as the ground electrode of the second electrode-supporting layer.

12. A piezoelectric sensor comprising:
   a first electrode-supporting portion that includes a first insulator;
   a second electrode-supporting portion that includes a second insulator;
   a polymeric piezoelectric body positioned between the first electrode-supporting portion and the second electrode-supporting portion so that the piezoelectric body, the first electrode-supporting portion and the second electrode-supporting portion are layered in a layering direction;
   a signal electrode possessing oppositely facing first and second surfaces, the first surface of the signal electrode being fixed to the first insulator and the second surface of the signal electrode facing the piezoelectric body;
   a ground electrode possessing oppositely facing first and second surfaces, the first surface of the ground electrode being fixed to the second insulator and the second surface of the ground electrode facing the piezoelectric body;
   the signal electrode possessing oppositely disposed edges spaced apart by a first length;
   the piezoelectric body possessing oppositely disposed edges spaced apart by a second length;
   the ground electrode possessing oppositely disposed edges spaced apart by a third length;
   wherein the first length of the signal electrode is less than the second length of the piezoelectric body, and the first length of the signal electrode is less than the third length of the ground electrode;
   wherein the opposite edges of the signal electrode are positioned inwardly of the opposite edges of the piezoelectric body; and
   wherein the first length of the signal electrode is positioned inwardly of the opposite edges of the ground electrode.

13. The piezoelectric sensor of claim 12, further comprising an adhesive connecting the signal electrode to the piezoelectric body and connecting the ground electrode to the piezoelectric body.

14. The piezoelectric sensor of claim 12, wherein the second surface of the signal electrode and the second surface of the ground electrode are fixed to and contact the piezoelectric body.

15. The piezoelectric sensor of claim 12, wherein a portion of the first insulator is attached to a portion of the second insulator.

16. The piezoelectric sensor of claim 12, further comprising a shielding electrode positioned on a side of the first insulator opposite the signal electrode.

17. The piezoelectric sensor of claim 16, further comprising a protective film covering the shielding electrode and fixed to the first insulator.

18. The piezoelectric sensor of claim 12, further comprising a wire connected to the piezoelectric body and configured to transmit electric signals generated by the piezoelectric body when the piezoelectric body is deformed.

* * * * *